(12) United States Patent
Davis et al.

(10) Patent No.: US 7,919,834 B2
(45) Date of Patent: Apr. 5, 2011

(54) EDGE SEAL FOR THRU-SILICON-VIA TECHNOLOGY

(75) Inventors: Robert Edgar Davis, Fishkill, NY (US); Robert Daniel Edwards, Marlboro, NY (US); J. Edwin Hostetter, Jr., Pleasant Valley, NY (US); Ping-Chuan Wang, Hopewell Junction, NY (US); Kimball M. Watson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 405 days.

(21) Appl. No.: 11/949,986

(22) Filed: Dec. 4, 2007

(65) Prior Publication Data
US 2009/0140395 A1 Jun. 4, 2009

(51) Int. Cl.
*H01L 29/40* (2006.01)
*H01L 23/04* (2006.01)
(52) U.S. Cl. .. 257/621; 257/276; 257/698; 257/E23.067
(58) Field of Classification Search .................. 257/621, 257/698, 276, E23.067; 438/667
See application file for complete search history.

(56) References Cited

U.S. PATENT DOCUMENTS

| 5,608,264 | A | * | 3/1997 | Gaul ............................. 257/734 |
| 5,998,292 | A | | 12/1999 | Black et al. |
| 6,078,068 | A | | 6/2000 | Tamura |
| 6,188,120 | B1 | | 2/2001 | Andricacos et al. |
| 6,734,090 | B2 | | 5/2004 | Agarwala et al. |
| 7,163,883 | B2 | | 1/2007 | Agarwala et al. |
| 2003/0020174 | A1 | * | 1/2003 | Kohno ......................... 257/774 |
| 2003/0199179 | A1 | | 10/2003 | Dozier, II et al. |
| 2004/0032009 | A1 | * | 2/2004 | Fang et al. ..................... 257/620 |
| 2004/0166661 | A1 | * | 8/2004 | Lei ................................. 438/614 |
| 2006/0220249 | A1 | | 10/2006 | Johnston et al. |
| 2009/0065239 | A1 | * | 3/2009 | Nakagawa ..................... 174/251 |

* cited by examiner

*Primary Examiner* — Shouxiang Hu
(74) *Attorney, Agent, or Firm* — John A. Jordan (57) ABSTRACT

One or more multilayer back side metallurgy (BSM) stack structures are formed on thru-silicon-vias (TSV). The multiple layers of metal may include an adhesion layer of chromium on the semiconductor wafer back side, a conductive layer of copper, diffusion barrier layer of nickel and a layer of nobel metal, such as, gold. To prevent edge attack of copper after dicing, the layer of nickel is formed to seal the copper edge. To also prevent edge attack of the layer of nickel after dicing, the layer of gold is formed to seal both the layer of copper and the layer of nickel.

9 Claims, 12 Drawing Sheets

EDGE SEAL FOR THRU-SILICON-VIA TECHNOLOGY

BACKGROUND OF THE INVENTION

1. Field of the Invention

The present invention relates to electrically interconnecting via structures, such as, Thru-Silicon-Via (TSV) structures as used to carry electrical signals vertically through a semiconductor die. More particularly, the present invention relates to the electrical contact made to the exposed TSV structures at the bottom of a semiconductor wafer.

2. Background and Related Art

In the packaging of electronic devices, such as, semiconductor chips and wafers, or semiconductor chip carriers, vertical interconnection to the next packaging level, whether it be a chip carrier or chip, may be achieved by Thru-Silicon-Vias (TSV). One prior art approach to creating conductive vias in semiconductor material, such as a silicon semiconductor wafer, is to use what might be called a "via first" approach. The general steps in such an approach are etching the vias, forming insulation layers on the via walls and metallization. When a "blind via" approach is used, the vias are not etch through the wafer so that a "thru-via" is rendered only after the carrier is suitably thinned to expose the via bottoms. An example of such an approach may be found in U.S. Pat. No. 5,998,292. FIGS. 1A-F, as described herein, generally disclose a process that may be used in the "blind via" approach.

One of the difficulties encountered in forming the back side metallurgy that makes electrical contact with the via exposed after thinning is forming reliable electrical contact structure. Reliable electrical contact structures often require multiple layers of metal to be formed at the wafer level. For example, one layer is used to provide good adhesion to the back side of the wafer and via, a second layer may be used on top of the adhesion layer to provide good conductivity and a third layer may be used as a barrier layer against diffusion of the second layer to the surface. A fourth layer may be used for oxidation/corrosion prevention. It is clear, however, that other multilayer metallurgy arrangements may be used.

However, it has been found that after the wafer is diced into chips, the various metal layers are exposed to ambient at the chip edge. Such exposure causes oxidation/corrosion at the edge of the metal layers and the edge attack affects the overall contact resistance and reliability of this multilayer metal contact.

SUMMARY OF THE PRESENT INVENTION

In accordance with the present invention, a multilayer metal contact structure on a wafer back side, and method of making such contact structure, is provided so as to prevent oxidation/corrosion due to edge attack of the metal layers by ambient after dicing of the wafer. To achieve this end, the layers of metal are patterned during deposition on the wafer so that the layer or layers of metal subject to oxidation are covered not only on their planar surface, but also at their edges. Such an arrangement may be used on any of a variety of types of multilayer metal structures.

It is, therefore, an object of the present invention to provide an improved electronic structure and method for fabricating same.

It is a further object of the present invention to provide an improved back side metal (BSM) contact to a chip conductive thru-via structure and method of making same.

It is yet a further object of the present invention to provide an improved metal contact structure to a Thru-Silicon-Via (TSV) and a method of making such improved metal contact structure.

It is yet still a further object of the present invention to provide a multilayer metal electrical contact structure arranged as the BSM of a wafer that contacts a conductive TSV such as to prevent oxidation of metal at the metal edges after dicing the wafer.

These, as well as other objects, are achieved in the present invention by forming the multilayer BSM of a semiconductor wafer so that an outer layer or layers of metal of the multilayer BSM structure cover the edges of a metal layer or layers below the outer layer or layers to thereby prevent deterioration of the layer or layers below due to oxidation, corrosion, and the like. More particularly, the present invention provides a method of protecting the edge walls of a multilayer metal stack from ambient attack by:

forming at least a first layer of metal on a substrate with said first layer of metal having edge walls defining the area of said first layer of metal; and forming a further layer of metal covering said at least first layer of metal and said edge walls defining the said area of said first layer of metal so that said further layer of metal provides sidewalls that protect the edge walls of said first layer of metal.

As further provided by the present invention, wherein said further layer of metal is formed so as to cover said first layer of metal and said edge walls of said first layer of metal and extend beyond the said sidewalls of said further layer of metal over a portion of said substrate beyond said sidewalls terminating in edge walls.

As still further provided by the present invention, the further step of forming another layer of metal covering said further layer of metal and the said sidewalls and edge walls of said further layer of metal so that said another layer of metal protects the said edge walls of said further layer of metal.

As yet still further provided by the present invention, wherein said another layer of metal is a layer of nobel metal.

As still further provided by the present invention, wherein said substrate is a semiconductor wafer and said multilayer metal stack is formed on the backside of each chip of an array of chips formed in said semiconductor wafer.

As yet further provided by the present invention wherein said nobel metal is conformally formed over said array of chips so that when the wafer is diced, said nobel metal covers the said edge walls of said further layer of metal.

As yet still further provided by the present invention, wherein an adhesion layer of chromium is formed between said first layer of metal and said substrate, and said first layer of metal is copper, said further layer of metal is nickel and said layer of nobel metal is gold.

In an embodiment of the present invention, an electronic structure is provided wherein at least one electrical conductor having one end extending to the surface of a layer of substrate material is provided and a multilayer metal contact structure is positioned on at least said one end of said electrical conductor. The multilayer metal contact structure includes at least a first layer of metal having edge walls defining the area of said first layer of metal and a further layer of metal covering said at least first layer of metal and said edge walls defining the said area of said first layer of metal so that said further layer of metal provides sidewalls that protect the edge walls of said first layer of metal.

In another embodiment of the present invention, the above multilayer metal contact structure includes another layer of metal covering said further layer of metal and the sidewalls of said further layer of metal.

In yet another embodiment of the present invention, the further layer of metal covers said first layer of metal and said edge walls of said first layer of metal and extends beyond the said sidewalls of said further layer of metal over a portion of the area of said layer of substrate material beyond said sidewalls terminating in edge walls and with said edge walls covered by said another layer of metal.

In yet still another embodiment of the present invention, wherein the electronic structure is a semiconductor chip and said another layer of metal covering the said edge walls of said further layer of metal is formed at the edge of said chip.

In a further embodiment of the present invention, an adhesion layer of metal is positioned between said first layer of metal and said chip.

In still a further embodiment of the present invention, the adhesion layer of metal is chromium, said first layer of metal is copper, said further layer of metal is nickel and said nobel metal is gold.

In another embodiment of the present invention, an electronic wafer structure is provided having an array of semiconductor chips with each chip having device interconnection metallurgy on the front side surface thereof and at least one conductive via extending through said chip from said surface front side surface metallurgy to back side surface multilayer metal contact structure on the backside surface of said chip, said backside multilayer metal contact structure on each chip including;
  at least a first layer of metal with said first layer of metal having edge walls defining the area of said first layer of metal; and
  a further layer of metal covering said at least first layer of metal and said edge walls defining the said area of said first layer of metal so that said further layer of metal provides side walls that protect the edge walls of said first layer of metal.

In yet another embodiment of the present invention, the electronic wafer structure wherein the back side multilayer metal contact structure of each chip includes said further layer of metal arranged to cover said first layer of metal and said edge walls of said first layer of metal and extends beyond the said side walls of said further layer of metal over a portion of the area of said chip beyond said side walls terminating in edge walls within the said area of said chip.

In yet another embodiment of the present invention the electronic wafer structure wherein said multilayer metal contact structure of each chip includes another layer of metal conformally covering said further layers of metal and the said side walls and edge walls of said further layer of metal and extends over the surface of said wafer to cover said array of semiconductor chips.

In a further embodiment of the present invention, the electronic wafer structure wherein said adhesion layer of metal is chromium, said first layer of metal is copper, said further layer of metal is nickel and said another layer of metal is gold.

In still yet another embodiment of the present invention, wherein said back side multilayer metal contact structure of each chip further includes an adhesion layer of metal positioned between said first layer of metal and said chip.

DETAILED DESCRIPTION OF THE DRAWINGS

Thru via technology is typically employed for vertically connecting electrical devices to the next level of packaging. Where the packaging of electronic devices involves semiconductor chips or wafers, or semiconductor chip carriers, the vertical interconnection may be made by Thru-Silicon-Vias (TSV). The TSV has been found useful for improved density in packaging, such as applied to 3D integration.

Although there are a variety of ways to obtain a thru via, one effective approach is to use the "blind via" approach. In this approach, the vias are not etched through the wafer so that a "thru-via" is obtained only after the carrier is suitably thinned to expose the via bottom.

Figure 1A:
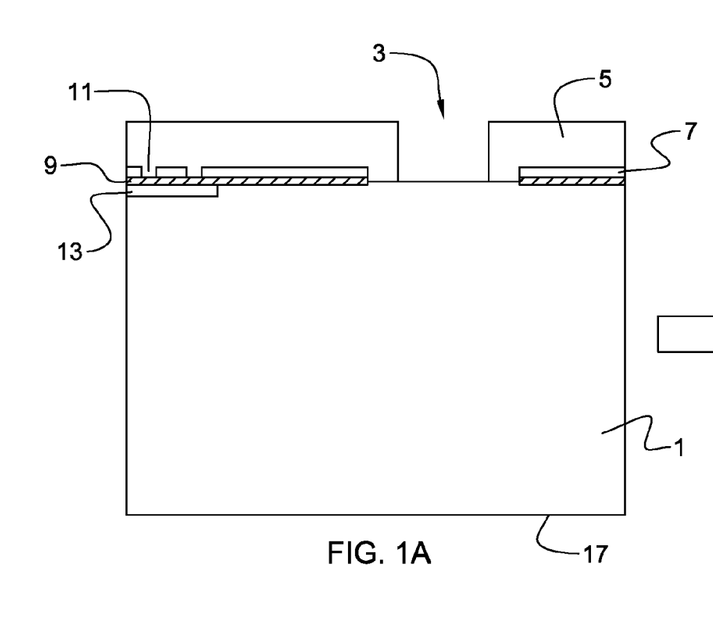
FIGS. 1A-1F show a series of steps representing one way of forming a thru via in a semiconductor structure.

FIG. 1A shows a cross section of a semiconductor chip 1 with an opening 3 etched in photoresist mask layer 5, as formed on the chip. As shown, mask 5 is formed on oxide layer 7 which oxide layer is, in turn, formed on nitride layer 9. Contact openings 11 are formed in this oxide for connecting to device silicide contact layer 13. It should be understood that although FIG. 1A shows the structure at the chip level for the sake of convenience, the processing described here takes place at the wafer level so that TSVs are formed in the back side of the chips at the wafer level.

Figure 1B:
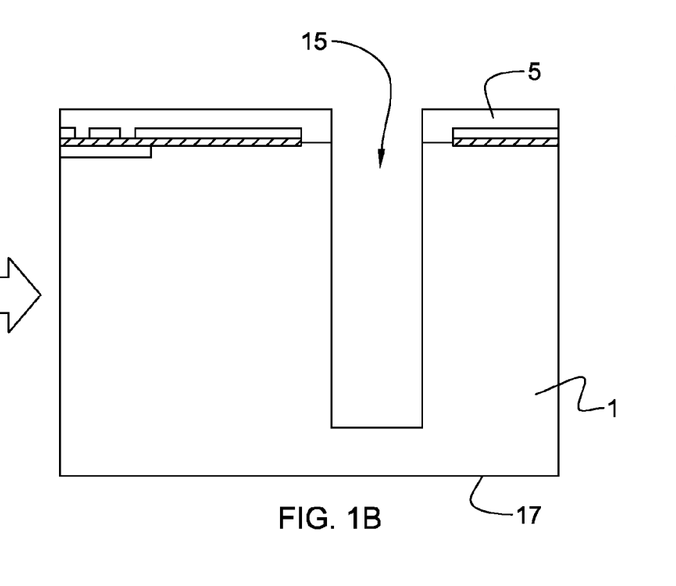

After forming opening 3 in resist mask 5, TSV 15, as shown in FIG. 1B, is formed by etching. Opening 3 may be round shape, for example, and 3 to 6 μm in diameter. However, it is clear that other opening shape, such as a square shape, and sizes may as readily be employed. A deep reactive ion etch (RIE) method, for example, may be used here to form TSV 15. Thus, deep silicon etching by fluorine radicals generated in a plasma, as is known in the art, may be employed. As shown in FIG. 1B, etching is terminated prior to reaching the bottom surface 17 of semiconductor chip 1. Typically, the TSV depth would be about 150 μm. Although any of a variety of semiconductors may be used for chip 1, typically silicon would be used.

Figure 1C:
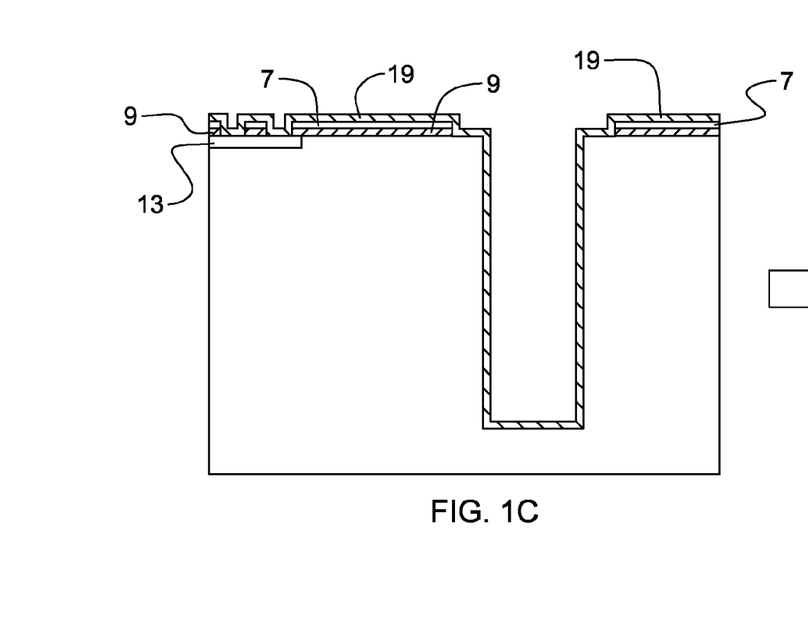
Figure 1D:
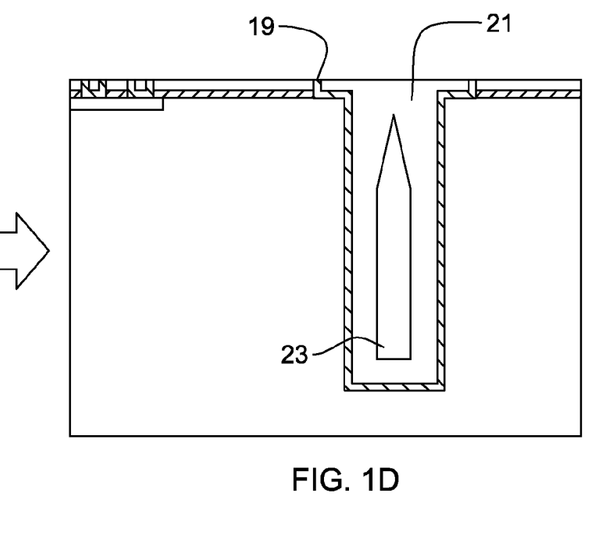

After forming TSV 15 in chip 1, the remainder of resist mask 5 is removed and liner 19 is conformally deposited in the via and on the oxide/nitride layers of the chip surface, as shown in FIG. 1C. The liner may, for example, be titanium, tantalum or tungsten, or compounds thereof, such as titanium nitride. The liner is then removed from the oxide/nitride layers on the chip by etching, and the TSV is filled with a conductive material, such as tungsten or copper, to form conductive via 21 of FIG. 1D. As shown in FIG. 1D, the conductive via material may not necessarily completely fill the via opening, as the central portion may have a void, as shown at 23. A plating process may be used to form conductive via connector 21.

Figure 1E:
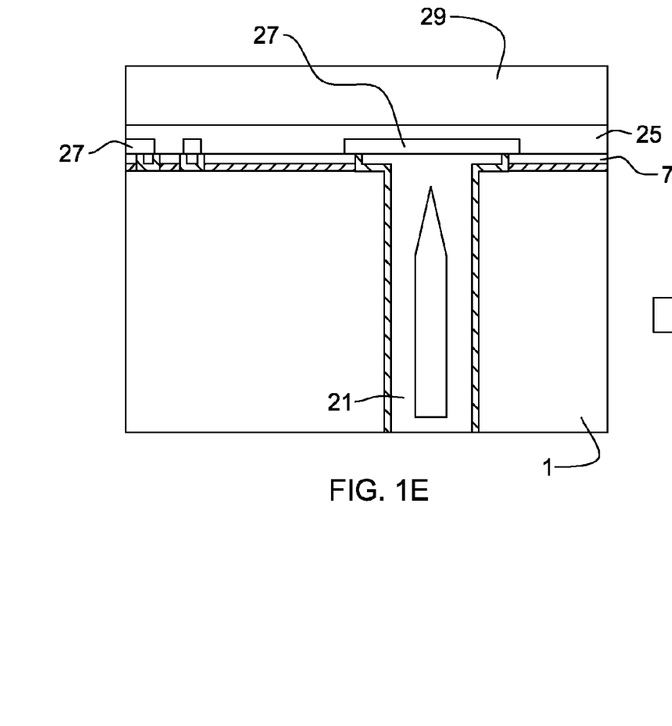

After forming conductive via 21, interlayer dielectric layer (IDL) 25 with its various layers of metallurgy, such as layer 27, is formed on oxide layer 7, as shown in FIG. 1E. Back side grind tape 29 is then attached and the back side of chip 1 is ground to remove silicon and expose conductive via connector 21, as shown in FIG. 1E. Typically, such silicon removal may be achieved by, for example, grinding and/or TMAH etch.

Figure 1F:
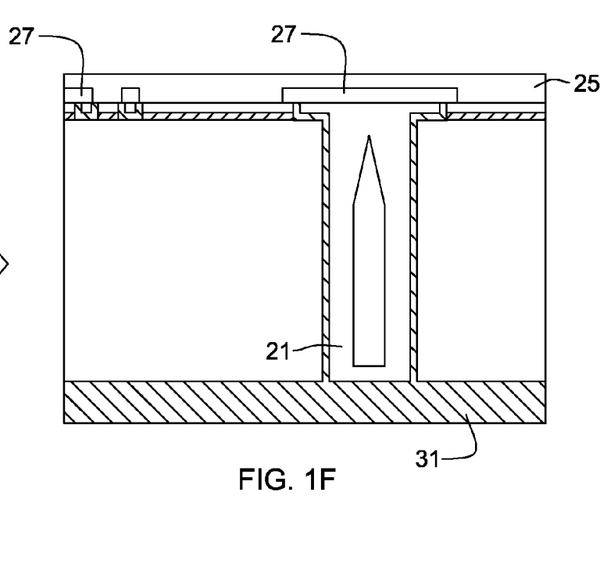

As shown in FIG. 1F, the back side grind tape 29 is then removed and multilayer metal electrical contact structure, shown as back side metal (BSM) 31, is formed on the back side of chip 1. Typically, BSM uses several layers of metal, an example of which is shown in FIGS. 2A-2D.

In the following description, specific details, such as specific metals, layers of metal and dimensions are set forth by way of example. It will be apparent to one skilled in the art that the present invention may be practiced without these specific details. In other instances, well known processing, such as associated with chemical vapor deposition (CVD), is not described in detail, in order not to unnecessarily obscure description of the present invention.

Figure 2A:
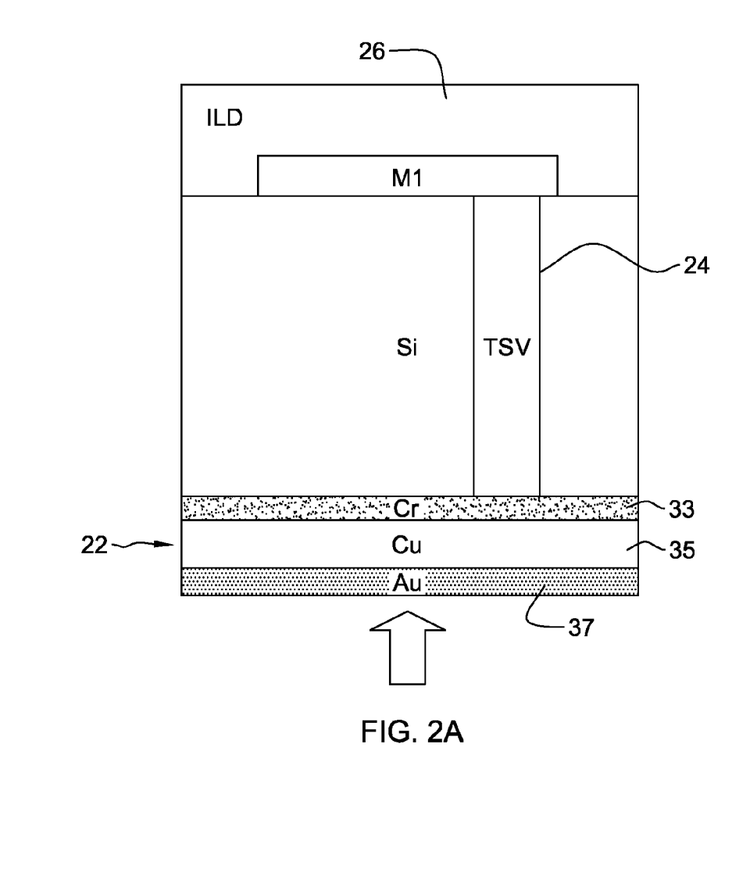
FIGS. 2A-2D shows a chip arrangement with metal edge exposure to ambient, and the manner of preventing edge attack on metal layers of a multilayer metal electrical contact structure electrically connected to a single thru-via of a chip.

FIG. 2A shows a chip arrangement with three layers of metal for BSM structure 22 attached to TSV 24 which via is, in turn, connected to ILD 26. TSV 24 is shown in FIG. 2A as a solid metal conductor but may have a void in its interior portion. One arrangement for BSM structure 22 would be to employ an adhesion layer 33 of chromium of approximately 0.2 μm, a good conductivity layer 35 of copper of approximately 1 μm and an oxidation/corrosion resistant layer 37 of a nobel metal, such as gold, of approximately 0.1 μm. The thicknesses used here are only by way of example. One of the difficulties with such a multilevel metal layer arranged is gold is not effective in protecting copper from oxidation because gold and copper readily interdiffuse.

One solution to this latter problem is to employ a further layer of nickel as a diffusion barrier between the gold layer and copper layer. It has been shown that nickel is effective in preventing interdiffusion between copper and gold and in preventing copper oxidation. In this regard, Auger analysis, for example, on the Cr/Cu/Ni/Au BSM stack structure has demonstrated that copper diffusion into the gold layer, under accelerated stress conditions, is substantially limited by the nickel barrier layer.

Figure 2B:
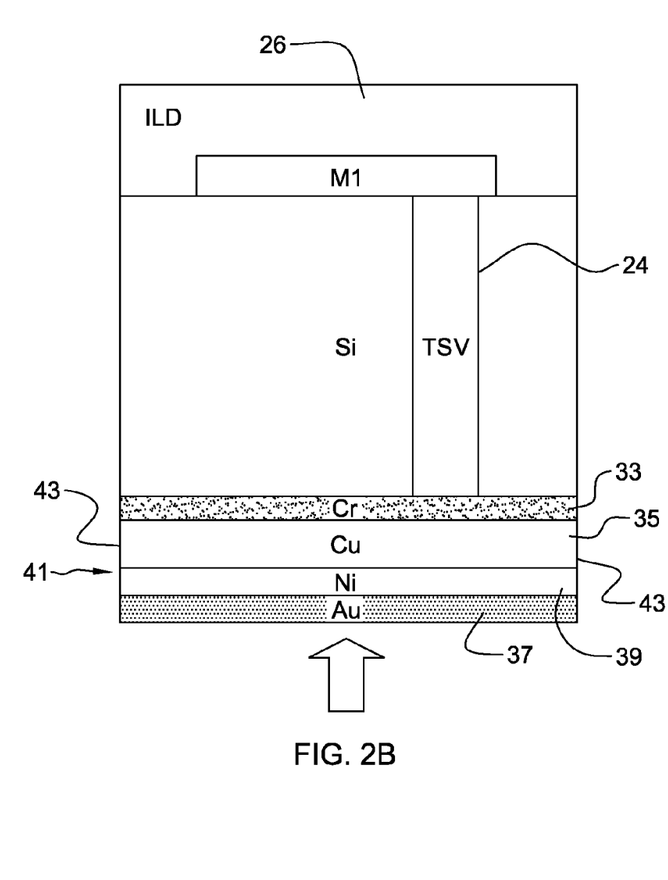

FIG. 2B shows a chip arrangement with BSM stack structure 41 that includes additional nickel layer 39. It is to be noted that the gold/nickel layers are effective against surface oxidation and work well at the wafer level. However, once the wafer is diced into chips, copper layer 35 is exposed to ambient at the chip edge 43 and is subject to oxidation at the edge. This is a result of the lack of protection from the nickel/gold layers.

Figure 2C:
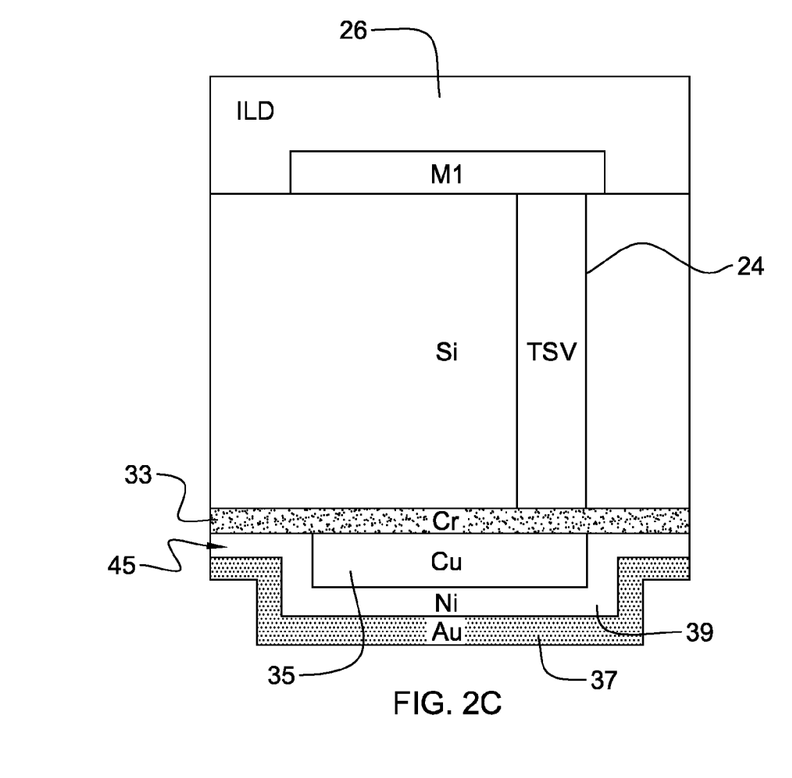

FIG. 2C depicts a way of providing an edge seal for copper, fabricated at the wafer level before dicing. This seal is provided by extended horizontal region 45 of nickel layer 39 with this horizontal region formed on chromium layer 33. With nickel layer surrounding copper layer 35 and horizontally extending along chromium layer 33, the edge of copper layer 35 is sealed and thereby protected from oxidation.

Although nickel layer 39 has an edge exposed after dicing the wafer, as shown in FIG. 2C, it is understood that nickel oxidation has a higher activation energy (~1.74 eV) than copper oxidation (~1.16 eV). In this regard, the extended horizontal region 45 acts as a protection buffer to protect the copper from oxidation.

Figure 2D:
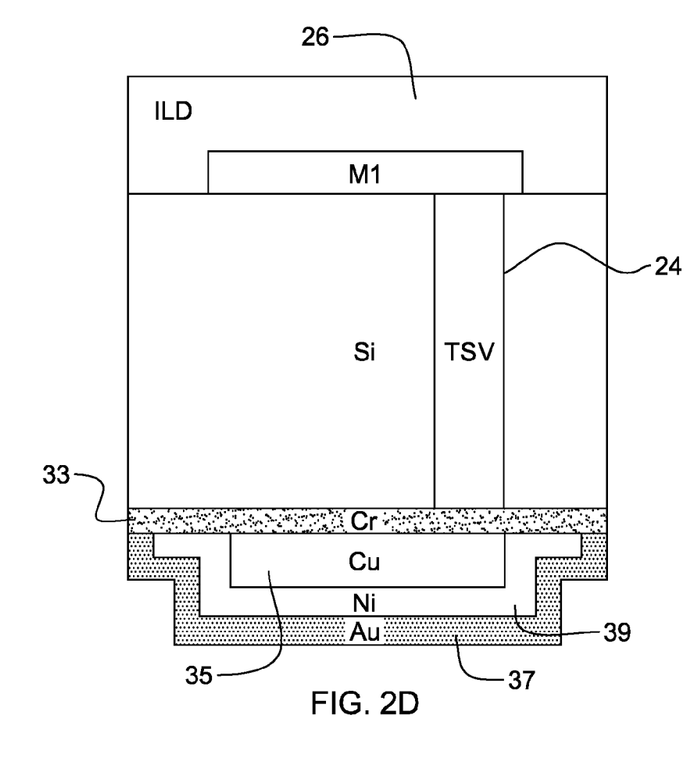

FIG. 2D, however, shows a further metal edge protection arrangement wherein nickel layer 39 is also edge sealed. As will be demonstrated in the figures that follow, the edge protection structure is formed at the wafer level. As shown in FIG. 2D, gold layer 37 is conformally formed so as to enclose and seal nickel layer 39 which layer, in turn, encloses and seals copper layer 35. This is achieved by shortening horizontal buffer region 45 of the nickel layer 39 and extending gold layer 37 to the surface of chromium layer 33.

It should be understood that although the BSM stack metallurgy structure, as disclosed above, describes metal layers as a chromium/copper/nickel/gold stack, it is clear that the edge seal approach, as described in accordance with the present invention, may be used on any of a variety of metal layer combinations. The stack could, for example, be titanium/copper/titanium/gold, chromium/copper/chromium/gold or tantalum/copper/tantalum/gold.

Figure 3A:
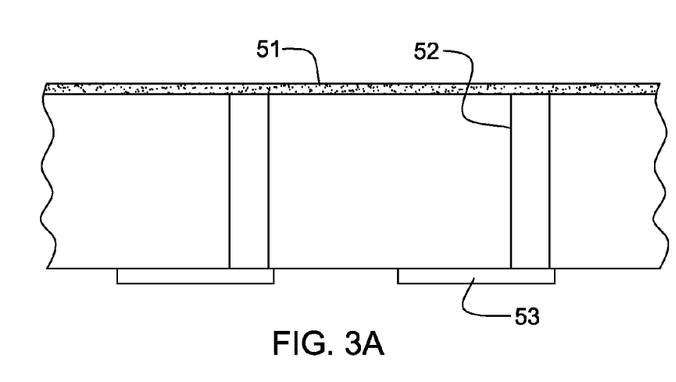
FIGS. 3A-3F show a series of steps depicting the manner of forming, at the wafer level, edge protection for one layer of metal in a multilayer metal electrical contact structure to a single thru-via per chip.
Figure 3B:
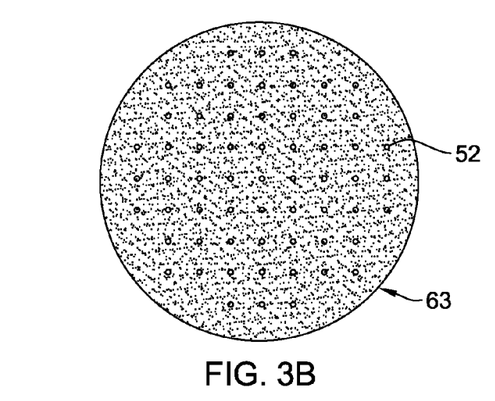

FIGS. 3A-F show the manner in which a single layer of metal edge seal may be fabricated at the wafer level for a chip with a single conductive TSV 52. It is to be noted, that for convenience of description, the following figures show the multilayer BSM structure flipped over so as to appear on the upside. FIG. 3A shows a cross-section of the blanket deposition of chromium layer 51 as an adhesion layer, and FIG. 3B shows a top view of the chromium at the wafer level. The chromium may be formed by any of a variety of techniques, such as, PVD or CVD. Layer 53 represents the interconnection structures on the front side of the wafer.

Figure 3C:
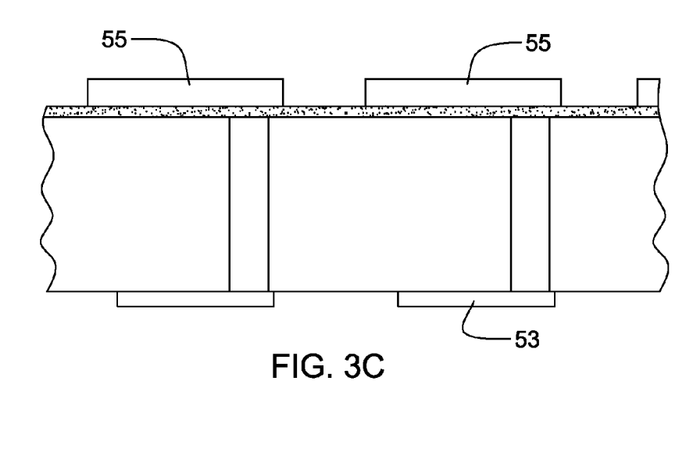
Figure 3D:
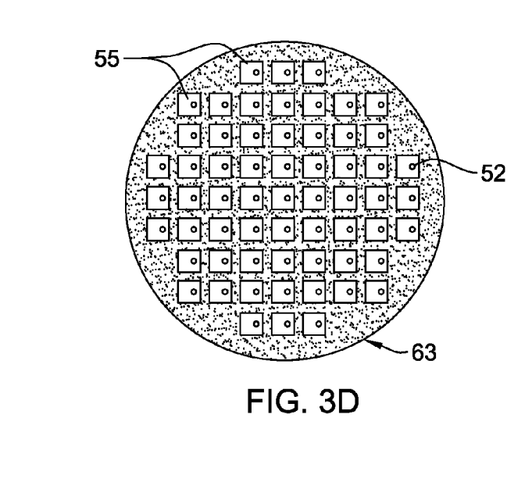
Figure 3E:
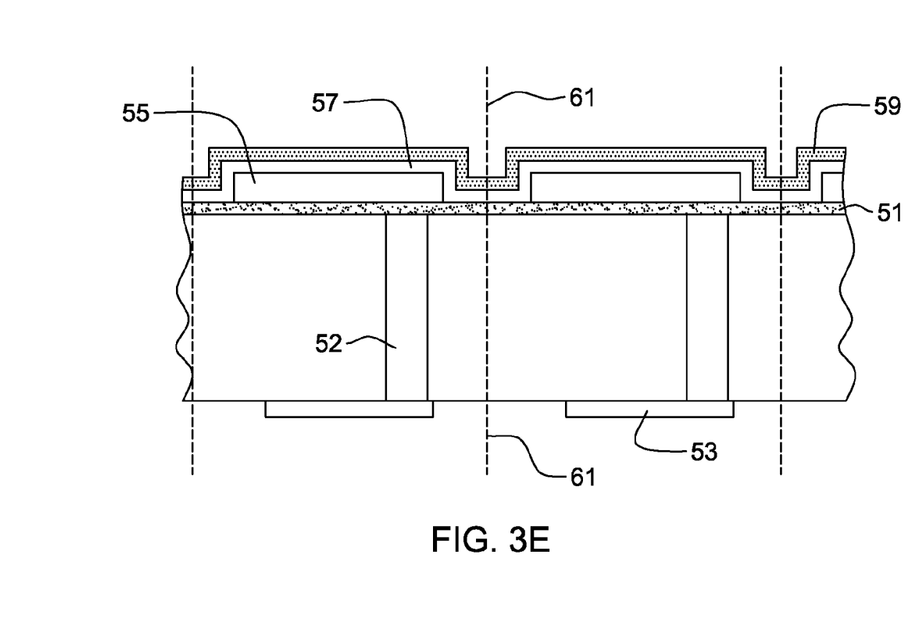

As shown in FIGS. 3C-D, a layer of copper is then deposited on the layer of chromium by PVD, for example, and etched with a photoresist mask using, for example, reactive ion etching (RIE) or wet etching, to form patterned copper layer 55 for the two chips shown in cutaway in FIG. 3E.

Figure 3F:
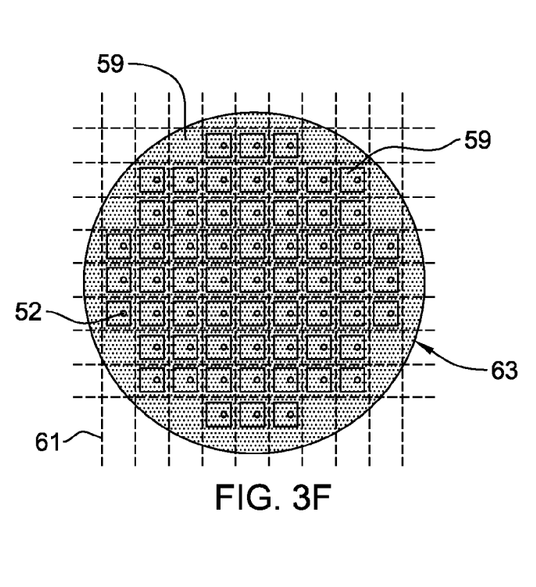

FIG. 3E shows a cutaway cross-section with conformal layers of nickel 57 and gold 59 blanket deposited on copper pad layer 55. These layers may also be deposited by PVD, for example. The dotted lines 61 in FIG. 3E show where wafer 63 in FIG. 3F is diced into chips. As can be seen in FIG. 3E, when the wafer is diced, copper layer 55 is edge sealed by nickel layer 57, as also shown in FIG. 2C.

Figure 4A:
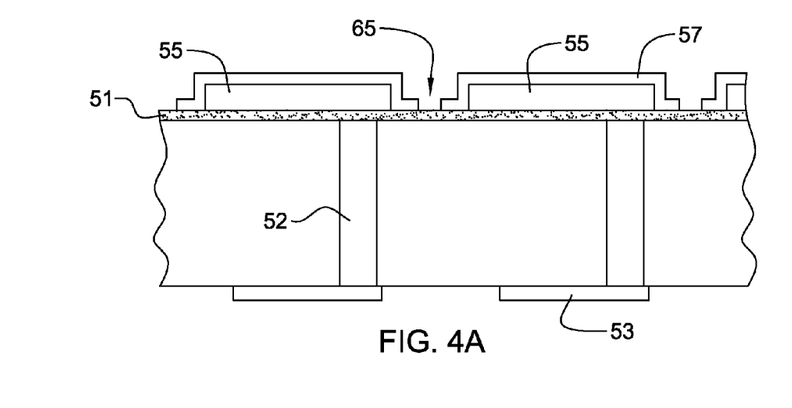
FIGS. 4A-4D show a series of steps depicting the manner of forming, at the wafer level, edge protection for multiple layers of metal in a multilayer metal electrical contact structure to a single thru-via per chip.
Figure 4B:
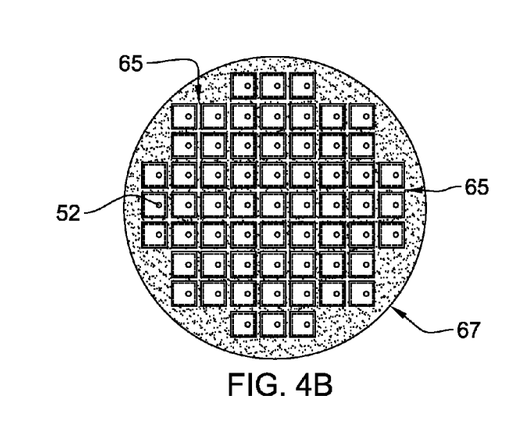

FIGS. 4A-D show the manner in which the edge seal for two layers of metal may be fabricated at the wafer level for a chip with a single conductive TSV 52. In this arrangement, after conformally depositing nickel layer 57 on copper layer 55, the nickel layer is etched back to chromium layer 51 to form a gap in the nickel layer at the edge of each chip of the wafer, as shown by gap 65. Again, this may be done at the wafer level with a photoresist mask and RIE or wet etching, for example. FIG. 4B shows a top view of the wafer 67 with etched gaps 65 in nickel layer 57 between each of the chips.

Figure 4C:
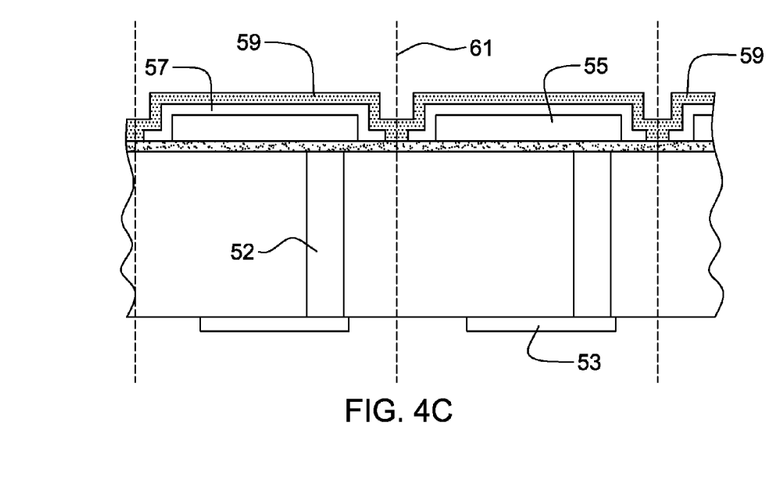
Figure 4D:
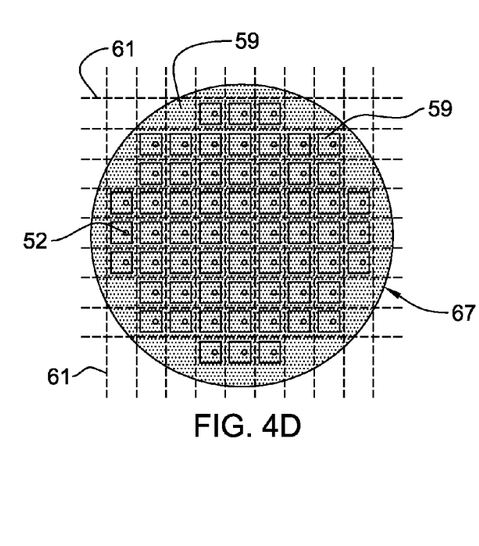

After etching nickel layer 57, a gold conformal layer 59 is deposited over nickel layer 57 and into gaps 65. FIG. 4D shows a top view of wafer 67 with gold layer 59 covering nickel layer 57 and filling in gaps 65. As a result, when wafer 67 is diced at lines 61, both metal layers, i.e. copper layer 55 and nickel layer 57, are sealed at their edges by gold layer 59 in the manner shown in FIG. 2D. It is clear that additional layers of metal could, similarly, be sealed at their edges.

FIGS. 5A-H show the manner in which the edge seal for a single layer of metal may be fabricated at the wafer level for a chip with two TSVs 71 and 73. Both TSVs 71 and 73 are shown connected to the layer 75 which layer represents an interconnection structure on the front side of the wafer. Similarly, TSVs 71 and 73 are shown connected to chromium layer 77.

Figure 5A:
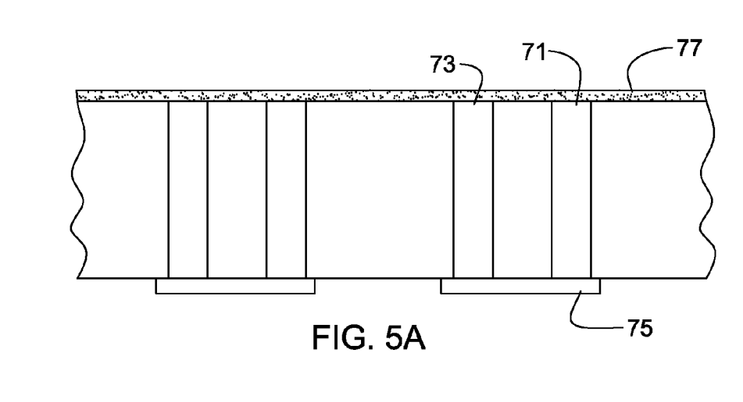
FIGS. 5A-5H show a series of steps depicting the manner of forming, at the wafer level, edge protection for one layer of metal in a multilayer metal electrical contact structure electrically connected to a pair of thru-vias per chip.
Figure 5B:
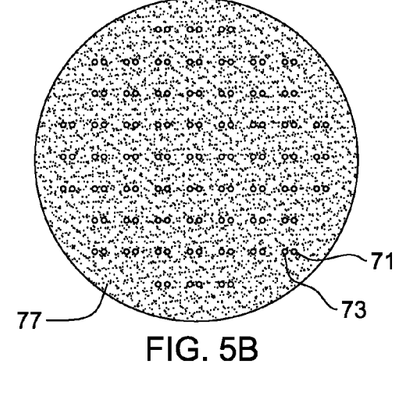
Figure 5C:
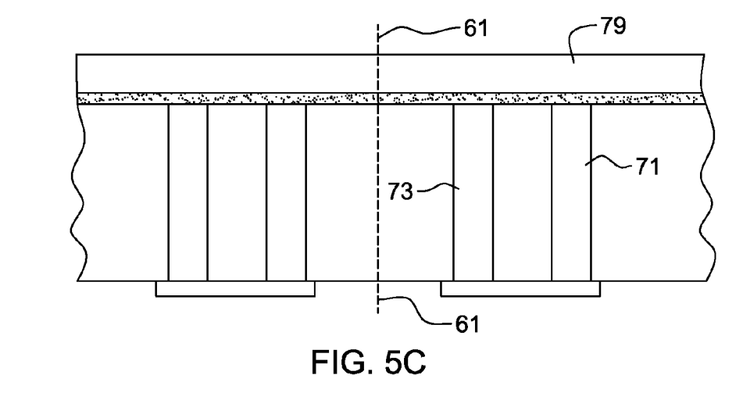
Figure 5D:
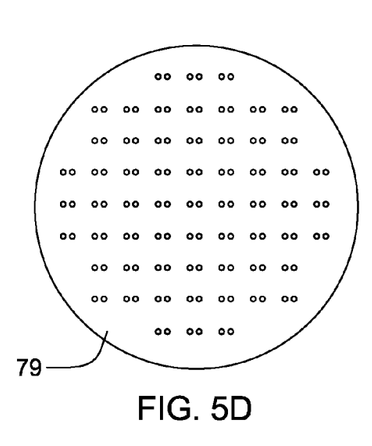
Figure 5E:
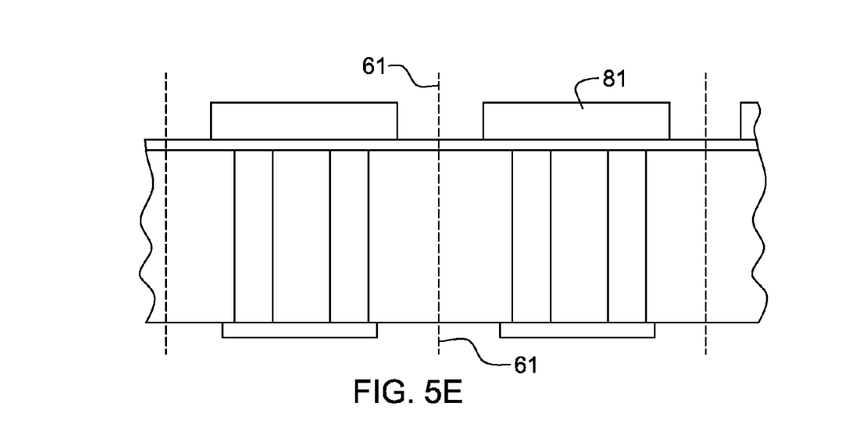
Figure 5F:
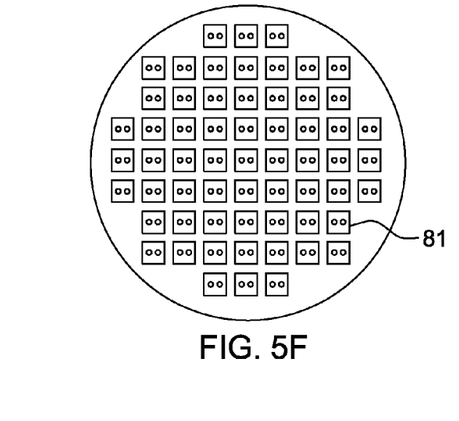
Figures 5G, 5H:
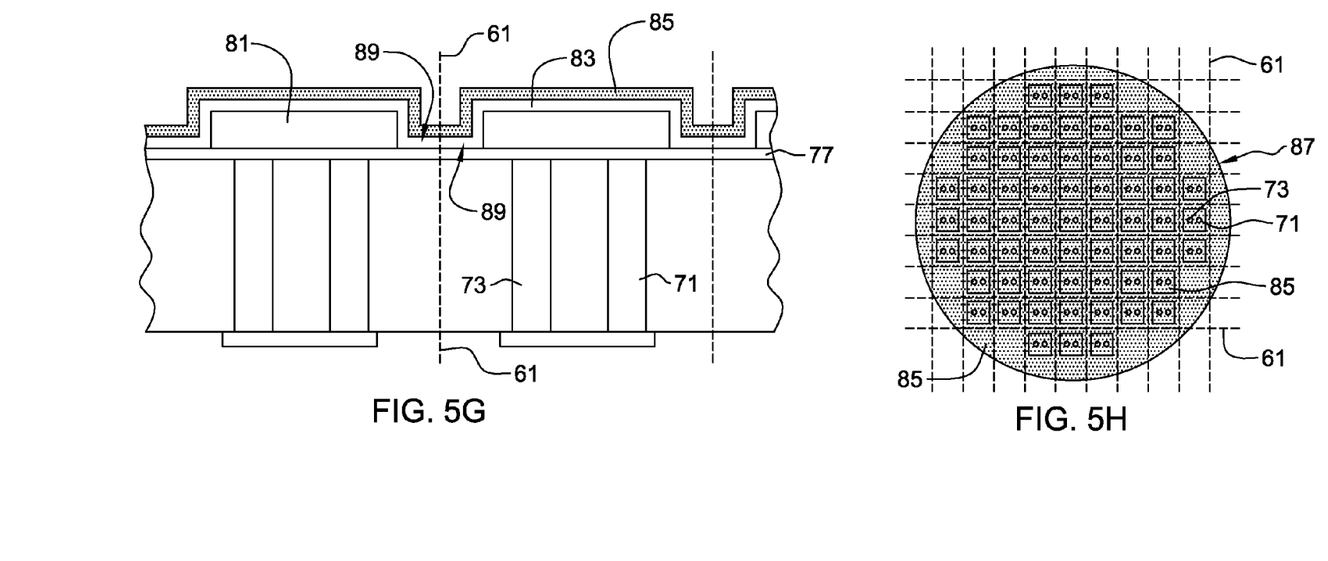

FIG. 5B shows the top view with chromium layer 77 and TSVs 71 and 73. The material deposition steps and patterning techniques for forming chromium layer 77, copper layer 79 to form copper pad layer 81, nickel layer 83 and gold layer 85, as shown in FIGS. 5A-H, are the same as described for FIG. 3 where after dicing one layer of metal is sealed at its edges. This can be seen in FIGS. 5G and 5H, where after dicing wafer 87 along the dotted lines 61, the extended horizontal region 89 of nickel layer 83, as shown in FIG. 5G, seals copper layer 81.

Figure 6A:
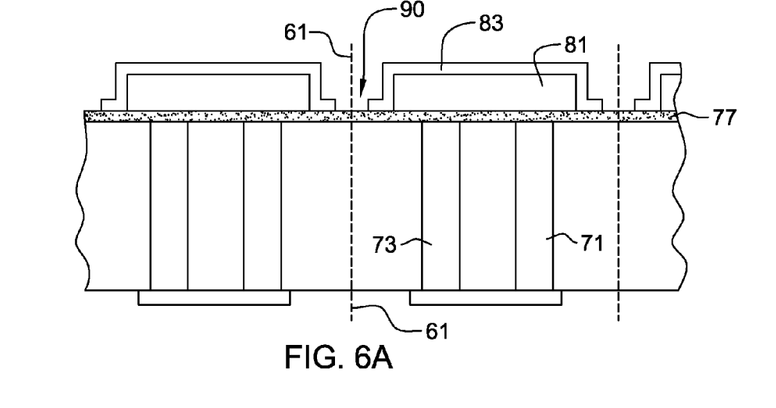
FIGS. 6A-6D show a series of steps depicting the manner of forming, at the wafer level, edge protection for multiple layers of metal in a multilayer metal electrical contact structure to electrically connected to a pair of thru-vias per chip.
Figure 6B:
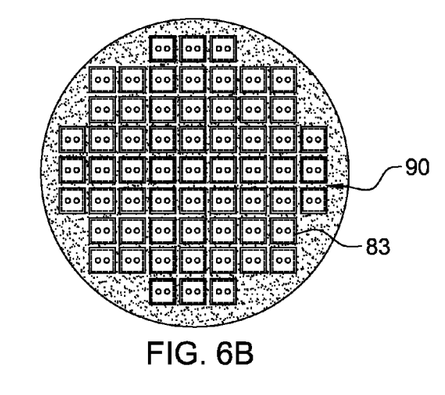

FIGS. 6A-D show the manner in which the edge seal for two layers of metal may be fabricated at the wafer level for a chip with two TSVs 71 and 73. Similar to FIG. 5A, a chromium adhesion layer 77 is first blanket deposited on the wafer as shown in FIG. 6A, and then patterned copper layer 81 is formed. Then, nickel layer 83 is deposited on copper layer 81 and etched to form gaps 90 in the same manner as described with regard to FIGS. 4A-C. FIG. 6B shows a top view of the wafer with each chip separated by gaps 90.

Figure 6C:
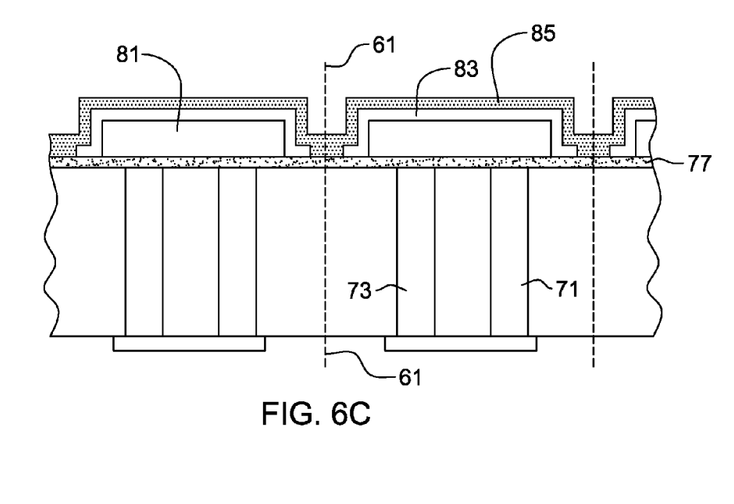
Figure 6D:
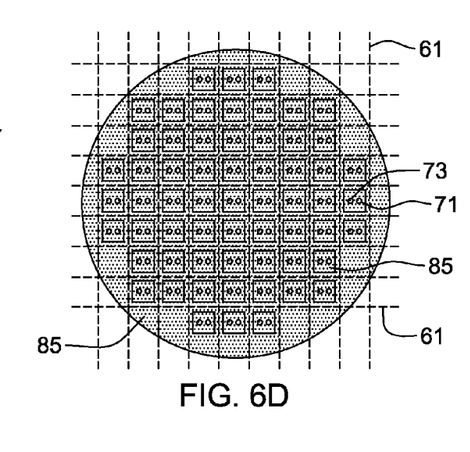

FIG. 6C shows the wafer structure after gold layer 85 is conformally deposited over nickel layer 83 and chromium layer 77 in nickel layer gaps 90. FIG. 6D shows a wafer top view with gold layer 85 deposited thereon.

After dicing the wafer along dotted line 61, as shown in FIG. 6D, it is clear that gold layer 85, as shown in FIG. 6C, acts to edge seal both copper layer 81 and nickel layer 83, as described hereinabove with regard to FIG. 4A-C.

Figure 7A:
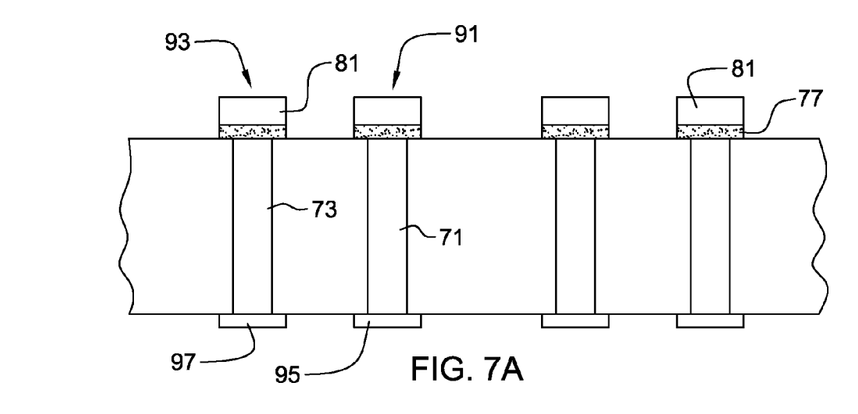
FIGS. 7A-7C show a series of steps depicting the manner of forming, at the wafer level, edge protection for individual multilayer metal electrical contact structures electrically connected to individual ones of a pair of thru-vias per chip.
Figure 7B:
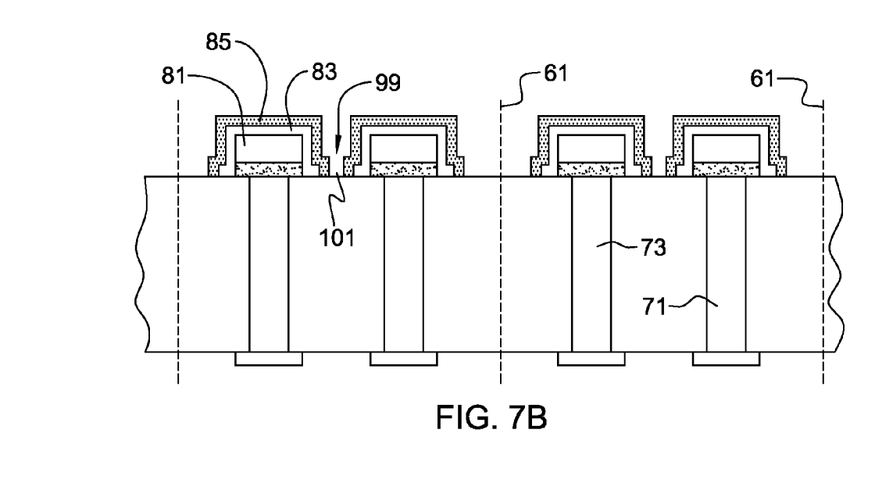
Figure 7C:
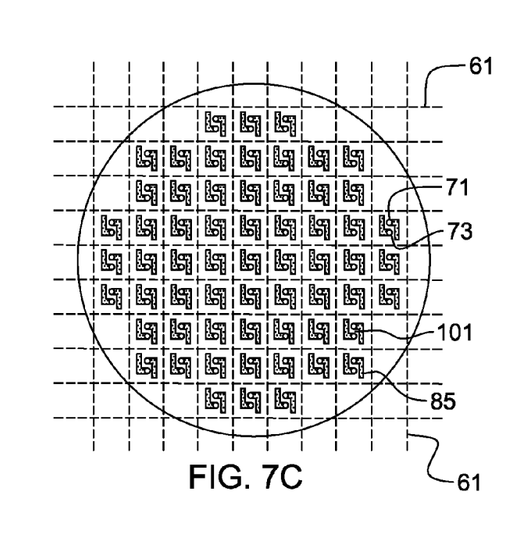

FIGS. 7A-C show chip arrangements where the two TSVs 71 and 73 of each chip have their own BSM multilayer contact pad stack structure of, for example, a chromium/copper/nickel/gold stack structure, as described above. Such a patterned BSM structure is advantageous for use where an extra wiring level may be required as, for example, in 3D chip integration.

In such an arrangement, both chromium layer 77 and copper layer 81 are patterned to form the beginning of individual BSM stack structures 91 and 93 on respective TSVs 71 and 73, as shown in FIG. 7A. Similarly, individual interconnection structures 95 and 97 on the front side of the wafer are connected to respective TSVs 71 and 73. Patterning copper layer 81 and chromium layer 77 may be done by conventional masking and etching techniques using, for example, photoresists and dry or wet etching.

As shown in FIG. 7B, nickel layer 83 is first conformally deposited over the copper and chromium stack structures 91 and 93 of FIG. 7A and over the chip surface between stack structures. Then, the nickel layer 83 is etched back to the chip surface to form gaps 99 between the stack structures. Thereafter, a gold layer 85 is conformally deposited over the nickel layer 83 and the semiconductor surface of the chip exposed by lateral gap 99 between the nickel covered stacks. The gold layer 85 is then etched back to the chip surface within the lateral portion deposited in gap 99 to form isolation channel 101, as shown in FIG. 7B and wafer top view 7C.

As is clear from FIG. 7B, the edges of copper layer 81 and nickel layer 83 are sealed by gold layer 85, as shown, in a manner similar to that shown in FIG. 4 and FIG. 6. This is also the case after dicing the wafer shown in FIG. 7C along dotted lines 61, as shown in FIG. 7B.

It is clear that not only may different metals of multiple layers be used, but that additional TSVs may be employed with individual BSM stack structures attached to single or multiple ones of the TSVs.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. An electronic structure, comprising:
    A substrate with a surface for supporting said electronic structure having at least one electrical conductor throughout said substrate with one end extending to said surface of said substrate from within said substrate;
    a multilayer metal contact structure positioned on at least said one end of said electrical conductor, said multilayer metal contact structure including at least a first layer of metal, said first layer of metal having edge walls, and a further layer of metal covering said at least first layer of metal and said edge walls of said first layer of metal so that said further layer of metal provides conformal side walls that protect the edge walls of said first layer of metal, said multilayer contact structure further including layer of another metal of a different metal material than the further layer of metal covering said further layer of metal and said conformal side walls of said further layer of metal,
    wherein said further layer of metal wraps said first layer of metal, and said further layer of metal extends along and contacts said surface of said substrate; and
    wherein said another layer of metal covers outmost side walls of said further layer of metal.

2. The electronic structure as set forth in claim 1 wherein said substrate is of semiconductor material.

3. The electronic structure as set forth in claim 2 wherein said electronic structure is a semiconductor chip and said another layer of metal is formed at an edge of said chip.

4. The electronic structure as set forth in claim 3 wherein said another layer of metal is a noble metal.

5. The electronic structure as set forth in claim 4 wherein an adhesion layer of metal is positioned between said first layer of metal and said substrate.

6. The electronic structure as set forth in claim 5 wherein said adhesion layer of metal is chromium, said first layer of metal is copper, said further layer of metal is nickel and said noble metal is gold.

7. An electronic wafer structure, said structure, comprising:
    an array of semiconductor chips with each chip having front side and back side surface areas and device interconnection metallurgy on the front side surface thereof and at least one conductive via extending through said chip from said front side surface metallurgy to back side surface multilayer metal contact structure on the back side surface of said chip, said back side multilayer metal contact structure on each chip including:
    at least a first layer of metal having edge walls;
    a further layer of metal covering said at least first layer of metal and said edge walls so that said further layer of metal provides conformal side walls that protect the edge walls of said first layer of metal and extends along and contacts the back side surface area of said chip, said further layer of metal terminating in edge walls within the back side surface area of said chip; and
    another layer of metal of a different metal material than the further layer of metal conformally covering said further layer of metal and said conformal side walls and edge walls of said further layer of metal and extending the back side surface area of said chip to cover said array of semiconductor chips, wherein said further layer of metal wraps said first layer of metal, and wherein said another layer of metal covers outmost side walls of said further layer of metal.

8. The electronic wafer structure as set forth in claim 7 wherein said multilayer metal contact structure of each chip further includes an adhesion layer of metal positioned between said first layer of metal and said chip.

9. The electronic wafer structure as set forth in claim 8 wherein said adhesion layer of metal is chromium, said first layer of metal is copper, said further layer of metal is nickel and said another layer of metal is gold.

* * * * *